United States Patent
Lee

(10) Patent No.: US 7,259,063 B2
(45) Date of Patent: Aug. 21, 2007

(54) METHOD FOR FORMING A GATE ELECTRODE IN A NON VOLATILE MEMORY DEVICE

(75) Inventor: Byung Seok Lee, Kyungki-Do (KR)

(73) Assignee: Hynix Semiconductor Inc., Kyungki-do (KR)

( * ) Notice: Subject to any disclaimer, the term of this patent is extended or adjusted under 35 U.S.C. 154(b) by 283 days.

(21) Appl. No.: 11/010,986

(22) Filed: Dec. 13, 2004

(65) Prior Publication Data

US 2006/0057805 A1   Mar. 16, 2006

(30) Foreign Application Priority Data

Sep. 15, 2004   (KR) .................. 10-2004-0073679

(51) Int. Cl.
  *H01L 21/336*   (2006.01)
(52) U.S. Cl. ...................... 438/257; 438/737
(58) Field of Classification Search ............... 438/257, 438/591, 737, 738, 739
   See application file for complete search history.

(56) References Cited

U.S. PATENT DOCUMENTS

2005/0095783 A1*   5/2005   Haselden et al. ........... 438/257

FOREIGN PATENT DOCUMENTS

KR   1020000043917 A   7/2000

OTHER PUBLICATIONS

Official Action in Corresponding KR Application No. 2004-0073679 dated Apr. 6, 2006.

* cited by examiner

*Primary Examiner*—Tuan H. Nguyen
(74) *Attorney, Agent, or Firm*—Marshall, Gerstein & Borun LLP

(57) ABSTRACT

Disclosed herein is a method for forming a gate electrode of a non-volatile memory device. In an etch process of a gate electrode for defining the gate electrode, the etch process is performed by selectively adding an addition gas containing carbon. This prevents undercuts from being formed on a sidewall of a control gate when a floating gate is etched. It is thus possible to form the gate electrode having a vertical profile.

11 Claims, 4 Drawing Sheets

METHOD FOR FORMING A GATE ELECTRODE IN A NON VOLATILE MEMORY DEVICE

BACKGROUND OF THE DISCLOSURE

1. Field of the Disclosure

The disclosure generally relates to a method for forming a gate electrode in a non-volatile memory device, and more specifically, to a method for forming a gate electrode in a non-volatile memory device in which it can prevent undercuts from being formed in a control gate in a process of etching the gate electrode for defining the gate electrode 2. Brief Description of Related Technology A non-volatile memory device (NVM), such as EPROM (Erasable Programmable Read-Only Memory), EEPROM (Electrically Erasable Programmable Read-Only Memory) and a flash memory, usually includes a gate electrode in which two electrodes are stacked. Generally, the electrode disposed at a lower layer is called a 'floating gate' and the electrode disposed at an upper layer is called a 'control gate'. Furthermore, an Inter-Poly Oxide (IPO) film (hereinafter, referred to as 'dielectric film') for enabling programmed electrons to be stored in the floating gate is intervened between the floating gate and the control gate.

A method for forming the gate electrode of the non-volatile memory device constructed above will now be described with reference to FIGS. 9 and 10. FIGS. 9 and 10 are cross-sectional views for explaining the method for forming the gate electrode of the non-volatile memory device in a prior art. Referring to FIGS. 9 and 10, a tunnel oxide film 11, a floating gate 12, a dielectric film 13, a control gate 14, a tungsten silicide layer 15 and a hard mask 16 are sequentially deposited on a semiconductor substrate 10. An etch process using a mask for gate electrode pattern is then performed to firstly pattern the hard mask 16. The mask for gate electrode pattern is removed. Thereafter, an etch process using the patterned hard mask 16 as an etch mask is performed to sequentially pattern the tungsten silicide layer 15, the control gate 14, the dielectric film 13, the floating gate 12 and the tunnel oxide film 11.

However, in the process of patterning the gate electrode, when the dielectric film 13 and the floating gate 12 are patterned after the control gate 14 is patterned, undercuts (see 'A' in FIG. 10) are generated in the control gate 14. The reason why the undercuts are generated in the control gate 14 is that the sidewalls of the control gate 14 are damaged by an etch gas when the dielectric film 13 and the floating gate 12 are patterned. If the undercuts are generated in the control gate 14 as such, the Critical Dimension ratio C/B of the gate electrode reduces.

Accordingly, in a process of oxidizing the gate electrode which is performed so as to compensate portions damaged after the gate electrode is patterned, a smiling phenomenon is severely generated in the dielectric film 13. Thus, there occurs a phenomenon that a thickness of the dielectric film 13 increases. In this time, the critical dimension ratio C/B of the gate electrode is the ratio of the critical dimension C of the control gate to the critical dimension B of the floating gate. Accordingly, there occurs a problem in that the program speed is slowed in view of device characteristic.

SUMMARY OF THE INVENTION

Accordingly, disclosed herein is a method for forming a gate electrode in a non-volatile memory device in which it can prevent undercuts from being formed in a control gate in an etch process of the gate electrode for defining the gate electrode. The method generally includes providing a semiconductor substrate in which a tunnel oxide film, a first polysilicon film for a floating gate, a dielectric film and a second polysilicon film for a control gate are formed, performing a first etch process in which an addition gas containing carbon is added to a main etch gas, thus patterning some of the second polysilicon film, the dielectric film and the first polysilicon film, and precluding the supply of the addition gas, and then performing a second etch process using the main etch gas only, thereby patterning the first polysilicon film and the tunnel oxide film which remain without being patterned.

Additional features of the method may become apparent to those skilled in the art from a review of the following detailed description, taken in conjunction with the drawing figures and the appended claims.

BRIEF DESCRIPTION OF THE DRAWINGS

For a more complete understanding of the disclosure, reference should be made to the following detailed description and accompanying drawing wherein.

Figure 1:
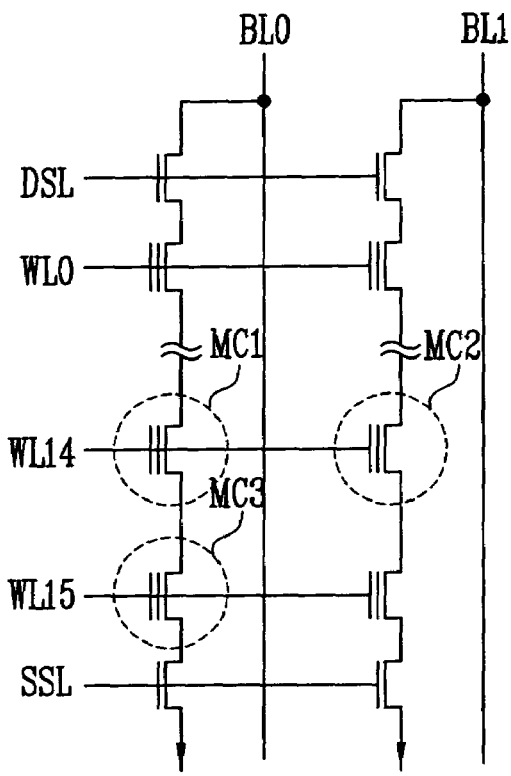
FIG. 1 is a circuit diagram for explaining a method for forming a gate electrode of a non-volatile memory device according to a preferred embodiment of the present invention.

While the disclosed method is susceptible of embodiments in various forms, there are illustrated in the drawings (and will hereafter be described) specific embodiments, with the understanding that the disclosure is intended to be illustrative, and is not intended to limit the claimed invention to the specific embodiments described and illustrated herein

DETAILED DESCRIPTION OF THE INVENTION

Now the preferred embodiments according to the present invention will be described with reference to the accompanying drawings. Since preferred embodiments are provided for the purpose that the ordinary skilled in the art are able to understand the present invention, they may be modified in various manners and the scope of the present invention is not limited by the preferred embodiments described later.

Figure 2:
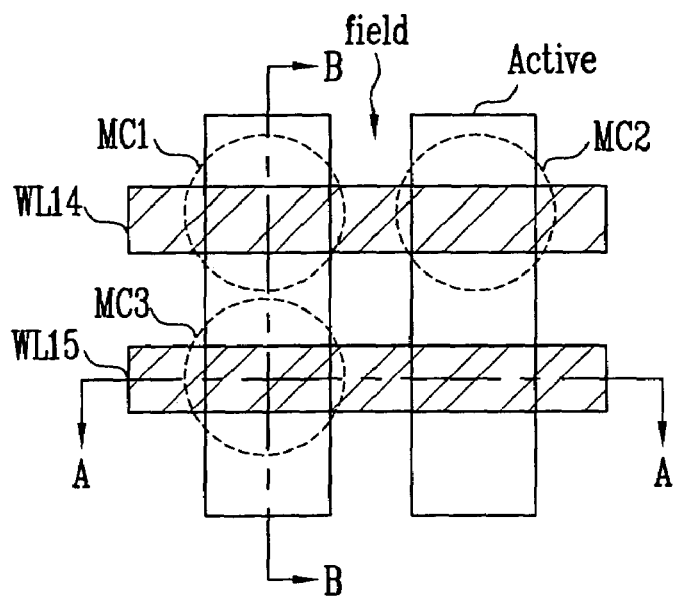
FIG. 2 is a plan view showing the non-volatile memory device of FIG. 1.
Figure 3:
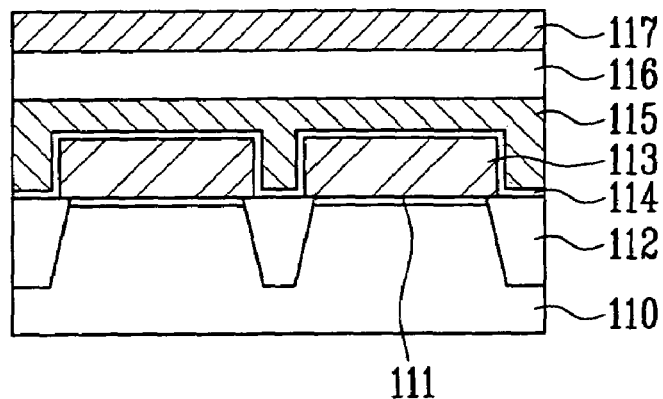
FIG. 3 is a cross-sectional view showing the non-volatile memory device taken along a line A-A in FIG. 2.
Figure 4:
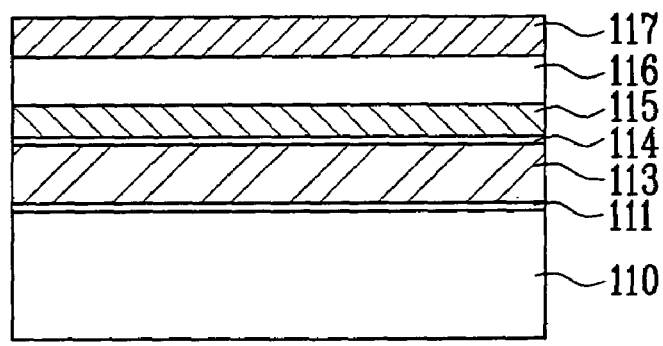
FIGS. 4 to 8 are cross-sectional views showing the non-volatile memory device taken along a line B-B in FIG. 2; and, FIGS. 9 and 10 are cross-sectional views for explaining a method for forming a gate electrode of a non-volatile memory device in a prior art.

FIG. 1 is a circuit diagram for explaining a method for forming a gate electrode of a non-volatile memory device according to a preferred embodiment of the present invention. FIG. 2 is a plan view showing the non-volatile memory device of FIG. 1. FIG. 3 is a cross-sectional view showing the non-volatile memory device taken along a line A-A in FIG. 2. FIGS. 4 to 8 are cross-sectional views showing the non-volatile memory device taken along a line B-B in FIG. 2. In the present invention, a NAND flash memory device is shown for explanation's convenience. Furthermore, like reference numerals are used to identify the same or similar parts.

Referring to FIGS. 1 through 4, a semiconductor substrate 110, which is cleaned by a pre-treatment cleaning process, is provided. The pre-treatment cleaning process can be performed using SC-1 ($NH_4OH/H_2O_2/H_2O$) after the semiconductor substrate is cleaned using DHF (Diluted HF), or can be performed using SC-1 after the semiconductor substrate is cleaned using BOE (Buffer Oxide Etchant). Thereafter, a screen oxide film (not shown) is formed on the semiconductor substrate 110. The screen oxide film serves to prevent the surface of the semiconductor substrate 110 from being damaged in a well ion implant process or a threshold voltage ion implant process, which is performed as a subsequent process. In this time, the well the ion implant process is performed in order to form a well region in the semiconductor substrate 110 and the threshold voltage ion implant process is performed in order to control the threshold voltage. Thereafter, the well ion implant process and the threshold voltage ion implant process are performed. Thereby, the well region (not shown) is formed in the semiconductor substrate 110. In this time, the well region can be formed to have a triple structure.

A tunnel oxide film 111 is then formed on the semiconductor substrate 110. In this time, the tunnel oxide film 111 can be formed by forming a pure oxide film at a temperature ranging from 750° C. to 800° C. through a wet oxidization process and then performing an annealing process on the pure oxide film using $N_2$ gas at a temperature ranging from 900° C. to 910° C. for 20 to 30 minutes. The reason why the annealing process is performed on the pure oxide film using $N_2$ gas after the pure oxide film is formed is for minimizing the defect density between the tunnel oxide film 111 and the surface of the semiconductor substrate 110.

In order to form an isolation film 112, a polysilicon film (not shown) (hereinafter, referred to as "first polysilicon film") is deposited on the tunnel oxide film 111 by means of a Self Aligned Shallow Trench Isolation (SASTI) process. In this case, however, in a preferred embodiment of the present invention, the isolation film 112 can be formed by means of a STI process instead of the SASTI process. Meanwhile, the first polysilicon film can be formed by depositing an undoped amorphous silicon film of a low oxidization-resistant property or a doped amorphous silicon film of a low concentration.

A capping layer (not shown) of a nitride film base is deposited on the first polysilicon film. In this time, the capping layer is preferably deposited sufficiently thickly in consideration of the recess in a subsequent Chemical Mechanical Polishing (CMP) process. This capping layer serves to protect the first polysilicon film in the subsequent CMP process. Thereafter, the capping layer, the first polysilicon film, the tunnel oxide film 111 and some of the semiconductor substrate 110 are etched by means of a photolithography process, thus forming trenches (not shown). Thereby, a field region and an active region are defined.

Next, an oxidization process can be carried out on the entire surface in which the trenches are formed in order to form well oxide films (not shown) on the internal sides of the trenches, the tunnel oxide film 111 and the first polysilicon film. In this time, the oxidization process can be performed at a temperature ranging from 800° C. to 900° C. so as to prevent re-crystallization of the first polysilicon film and can be performed so as to form the well oxide films to a thickness of 30' to 100' with respect to a monitoring wafer target. The reason why the oxidization process is performed is for compensating the sidewalls within the trench, which can be damaged in the etch process for forming the trenches.

Furthermore, the oxidization process is performed in order to make a profile at top/bottom edge portions of the trenches rounded and to reduce the critical dimension (CD) in the active region.

An insulating film for an isolation film is then deposited on the entire surface in which the trenches are formed so that the trenches are gap-filled. In this time, the insulating film for the isolation film employs a high-density plasma (HDP) oxide film. The HDP oxide film has a good gap-fill characteristic of the trench. The entire surface including the HDP oxide film is polished by CMP using the capping layer as an etch-stop layer. Thereafter, the capping layer is stripped by means of an etch process using phosphoric acid ($H_3PO_4$).

A polysilicon film 113 for a floating gate (hereinafter, referred to as 'second polysilicon film') is then deposited on the entire surface from which the capping layer is stripped. In this time, the second polysilicon film 113 can be deposited using an undoped amorphous silicon film of a low oxidization-resistant property or a doped amorphous silicon film of a low concentration. In this time, the undoped amorphous silicon film can be deposited to a thickness of 1000' to 3000' at a temperature ranging from 480° C. to 550° C. by means of low-pressure chemical vapor deposition (LPCVD) using $SiH_4$ gas. Also, the doped amorphous silicon film can be deposited to a thickness of 1000' to 3000' by LPCVD using $Si_2H6$ and $PH_3$ gas at a temperature ranging from 480° C. to 550° C. and a low pressure ranging from 0.1 torr to 0.3 torr.

The second polysilicon film 113 is then patterned by means of an etch process using a photolithography process. The second polysilicon film 113 is thus divided with respect to the isolation film 112. Meanwhile, an anti-reflection film (not shown) can be deposited on the second polysilicon film 113 before the photoresist process is performed. The anti-reflection film serves to light from reflecting in the photolithography process.

A dielectric film 114 is deposited along the step on the entire surface including the patterned second polysilicon film 113. In this time, the dielectric film 114 can be formed using an oxide film/nitride film/oxide film ($SiO_2/Si_3N_4/SiO_2$). Furthermore, the oxide film can be formed by depositing a hot temperature oxide film using DCS (Dichloro Silane, $SiH_2Cl_2$) of a good voltage-resistant property and a good TDDB (Time Dependent Dielectric Breakdown) property and $N_2O$ gas as a source. In this time, the oxide film can be deposited by CVD, plasma-enhanced CVD (PECVD) or atmospheric-pressure CVD (APCVD) under process condition of a good step coverage in which a pressure is 0.1 torr to 3 torr and a temperature ranges from 810° C. to 850° C. with the semiconductor substrate 110 being loaded at a temperature ranging from 600° C. to 700° C. Meanwhile, the nitride film can be deposited by CVD, PECVD or APCVD of a good step coverage using DCS and $NH_3$ gas at a low pressure of 1 torr to 3 torr and a temperature of approximately 650° C. to 800° C.

A polysilicon film 115 for a control gate (hereinafter, referred to as 'third polysilicon film') is then deposited on the dielectric film 114. In this time, the third polysilicon film 115 can be formed in the same method as the second polysilicon film 113. However, a thickness of the third polysilicon film 115 can vary depending upon a specification of a device. Thereafter, a metal silicide layer 116 is formed on the third polysilicon film 115. The metal silicide layer 116 serves to lower resistance of the third polysilicon film 115. In this time, the metal silicide layer 116 can be formed using any one of metals such as tungsten, titanium and nickel. The method for forming the metal silicide layer 116 includes the steps of depositing a metal layer on the third polysilicon film 115 and then performing a thermal treatment process at least once.

A hard mask 117 can be then deposited on the metal silicide layer 116. In this time, the hard mask 117 can be formed using nitride LP (Low Pressure)-nitride or PE (Plasma Enhanced-nitride) or an oxynitride film, or PE-TEOS (Plasma Enhanced Tetra Ethyle Ortho Silicate), LP-TEOS (Low Pressure TEOS), HTO (High Temperature Oxide) or USG (Undoped Silicate Glass) oxide film.

Meanwhile, reference numerals MC1 to MC3, which are not described in FIG. 1 and FIG. 2, refer to memory cells.

In explaining the method for forming the gate electrode, subsequent processes will be described with reference to the cross-sectional views taken along a line B'B FIG. 2 for explanation's convenience. A thickness of each of elements shown in the drawings can vary, if needed.

Figure 5:
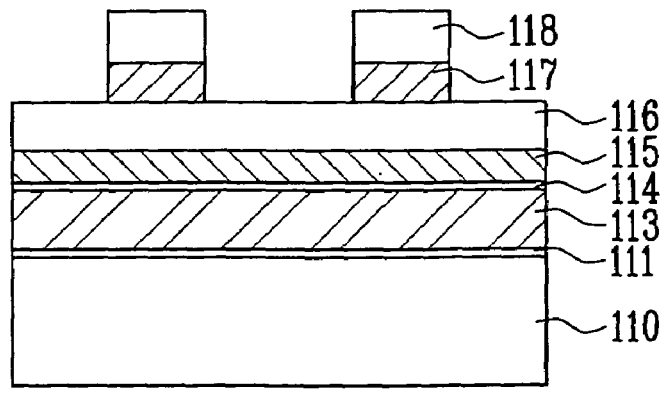

Referring to FIG. 5, a photoresist pattern 118 is formed on the hard mask 117. In this time, the photoresist pattern 118 can be formed by coating a photoresist on the hard mask 117 and then performing exposure and development processes using a photo mask for defining the gate electrode. An etch process using the photoresist pattern 118 is then performed to pattern the hard mask 117. Thereafter, the photoresist pattern 118 is stripped by a strip process.

Figure 6:
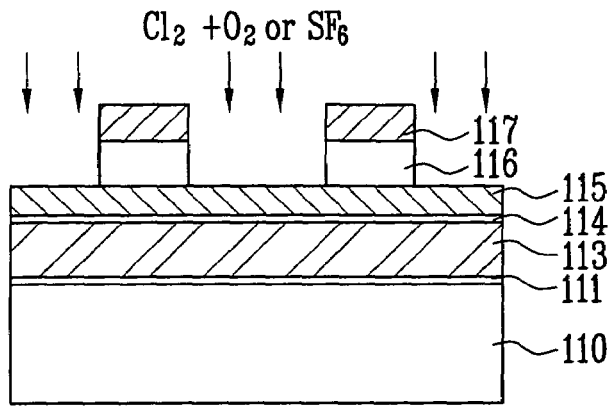

Referring to FIG. 6, the metal silicide layer 116 is patterned by an etch process using the patterned hard mask 117 as an etch mask. In this time, the etch process may employ a mixing gas of $Cl_2$ and $O_2$, $SF_6$ gas, or a mixing gas of them.

Figure 7:
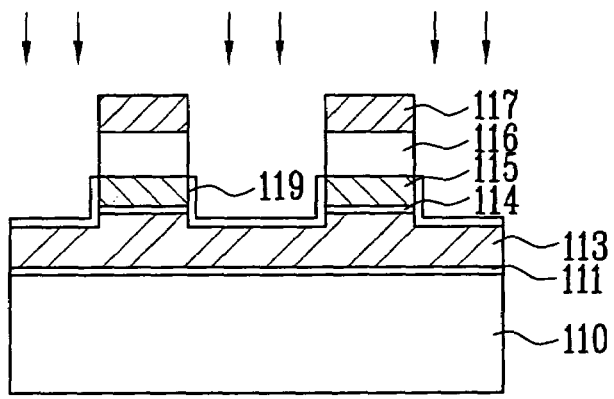

Referring to FIG. 7, some of the third polysilicon film 115, the dielectric film 114 and the second polysilicon film 113 is patterned by an etch process in which an addition gas containing carbon is added to a main etch gas. In this time, in the etch process, an etch target is set so that even some of the top of the second polysilicon film 113 is patterned. Meanwhile, the addition gas containing carbon can be any one of $CF_4$, $CHF_3$, $C_2F_6$, $CH_2F_2$, $C_4F_8$, $C_3F_8$, $C_5F_8$ and $CH_3F$, or a mixing gas in which at least two of them is mixed. Furthermore, in the etch process, the ratio of the addition gas containing carbon is approximately 0.5 to 2 times higher than that of $Cl_2$ or HBr being the main etch gas.

For example, the patterning process of the third polysilicon film 115 can be performed by precluding the supply of the $SF_6$ gas into an etch chamber used to pattern the metal silicide layer 116 and supplying the addition gas containing carbon while supplying HBr gas instead of the $SF_6$ gas. The reason why the HBr gas is used instead of the $SF_6$ gas is that a profile of the polysilicon film can be formed stably. In the etch process for etching the third polysilicon film 115, $Cl_2$ gas only can be used as the main etch gas. However, considering the profile of the polysilicon film, the HBr gas, or a mixing gas of the $Cl_2$ gas and the HBr gas is preferably used.

Meanwhile, in the etch process for etching the third polysilicon film 115, the third polysilicon film 115 is etched by the main etch gas and is thus patterned. However, during the etch process of the third polysilicon film 115, carbon contained in the addition gas is infiltrated into the sidewall of the third polysilicon film 115. A passivation layer 119 is thus formed on the sidewalls of some of the third polysilicon film 115, the dielectric film 114 and the second polysilicon film 113 (in reality, portions which are exposed in the etch process of the third polysilicon film. The passivation layer 119 functions to reduce the etch rate of the third polysilicon film 115 by the main gas. Accordingly, when the dielectric film 114 and the second polysilicon film 113 are etched, the passivation layer 119 performs a mitigation action to prevent undercuts from being generated in the third polysilicon film 115. Furthermore, in the etch process for etching the third polysilicon film 115, the etch target is taken to some of the top of the second polysilicon film 113. Undercuts can be thus prevented in the third polysilicon film 115. Therefore, the third polysilicon film 115 having a vertical profile can be formed.

Figure 8:
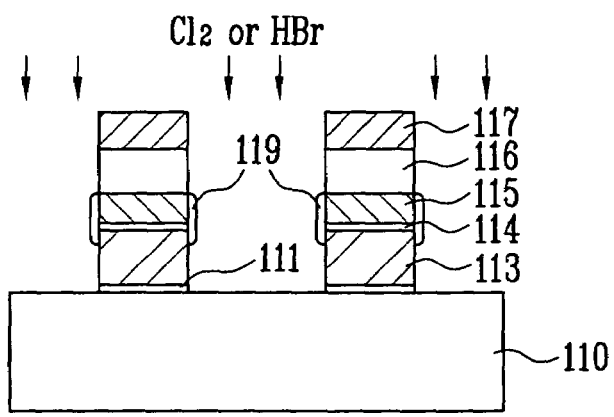
Figure 9:
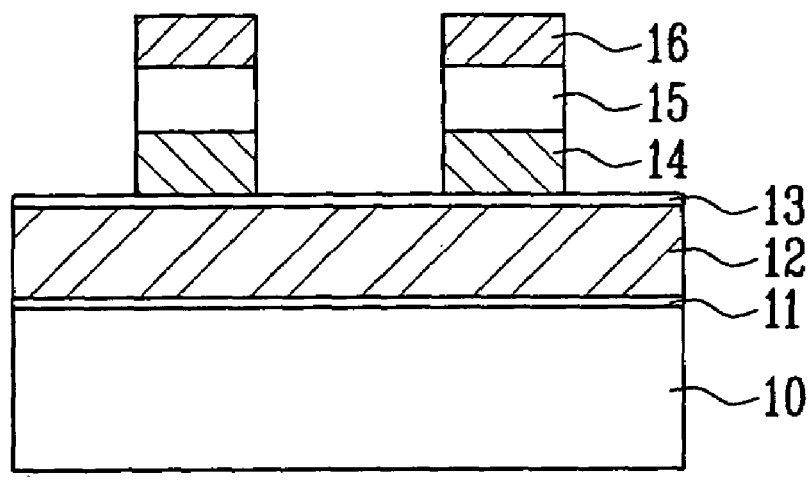
Figure 10:
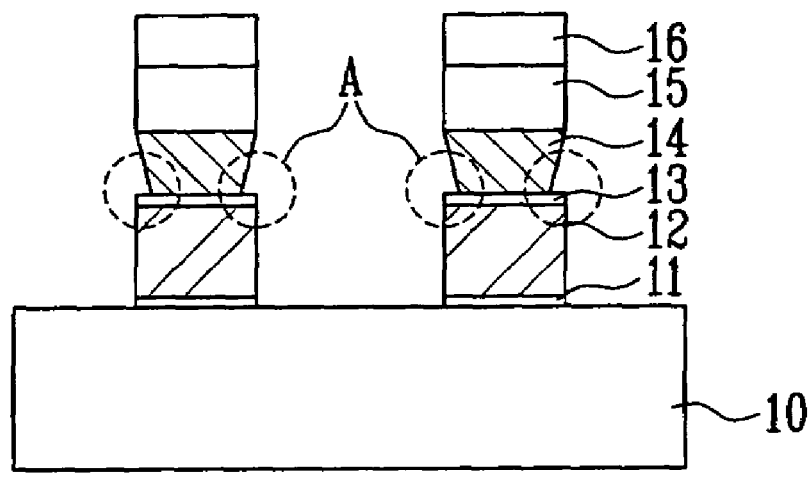

Referring to FIG. 8, after the addition gas containing carbon which is supplied into the etch chamber is precluded, the second polysilicon film 113 and the tunnel oxide film 111 are patterned by means of an etch process using the main etch gas only. Some of the semiconductor substrate 110 is thereby exposed. By precluding the addition gas containing carbon in the etch process of the second polysilicon film 113, the passivation layer 119 is not further formed but only the second polysilicon film 113 and the tunnel oxide film 111 are patterned intact. Accordingly, the gate electrode consisting of the metal silicide layer 116, the third polysilicon film 115, the dielectric film 114, the second polysilicon film 113 and the tunnel oxide film 111 is defined.

Meanwhile, the passivation layer 119 formed in FIG. 7 is removed by a subsequent oxidization process. $O_2$ supplied in the oxidization process and carbon contained in the passivation layer 119 react, so that carbon is removed. In this time, the oxidization process is performed in order to compensate portions damaged in the patterning of the gate electrode and is performed on the sidewall of the gate electrode under $O_2$ atmosphere.

As described above, according to the present invention, in an etch process of a gate electrode for defining the gate electrode, the etch process is performed by selectively adding an addition gas containing carbon. It prevents undercuts from being formed on a sidewall of a control gate when a floating gate is etched. It is thus possible to form the gate electrode having a vertical profile. Accordingly, the ratio of the critical dimension of the gate electrode can be maintained over 90% even after a subsequent oxidization process.

Although the foregoing description has been made with reference to the preferred embodiments, it is to be understood that changes and modifications of the present invention may be made by the ordinary skilled in the art without departing from the spirit and scope of the present invention and appended claims.

What is claimed is:

1. A method for forming a gate electrode of a non-volatile memory device, comprising the steps of:
    (a) providing a semiconductor substrate in which a tunnel oxide film, a first polysilicon film for a floating gate, a dielectric film and a second polysilicon film for a control gate are formed;
    (b) performing a first etch process in which an addition gas containing carbon is added to a main etch gas, thus patterning the second polysilicon film, the dielectric film and a portion of the first polysilicon film; and
    (c) precluding the supply of the addition gas, and then performing a second etch process using the main etch gas, thereby patterning the first polysilicon film and the tunnel oxide film which remain without being patterned.

2. The method as claimed in claim 1, wherein the main etch gas employs $Cl_2$ or HBr.

3. The method as claimed in claim 1, wherein the addition gas is supplied 0.5 to 2 times more than the main etch gas.

4. The method as claimed in claim 3, wherein the addition gas is any one of $CF_4$, $CHF_3$, $C_2F_6$, $CH_2F_2$, $C_4F_8$, $C_{38}$, $C_5F_8$ and $CH_3F$, or a mixing gas of at least two of them.

5. The method as claimed in claim 1, wherein a passivation layer is formed on some of the second polysilicon film, the dielectric film and the first polysilicon film, which are patterned and exposed by carbon of the addition gas in the first etch process, in the step (b).

6. The method as claimed in claim 1, further comprising the step of forming a metal silicide layer on the second polysilicon film in the step (a).

7. The method as claimed in claim 6, wherein before the step (b), the metal silicide layer is etched and patterned by a third etch process using $Cl_2$ or $SF_6$ gas.

8. The method as claimed in claim 7, wherein the first to third etch processes are performed in the same etch chamber.

9. The method as claimed in claim 6, further comprising the step of forming a hard mask on the metal silicide layer in the step (a).

10. The method as claimed in claim 6, wherein the hard mask serves as an etch mask in the first etch process.

11. The method as claimed in claim 1, wherein the first and second etch processes are performed in the same etch chamber.

* * * * *